(12) United States Patent
Liu et al.

(10) Patent No.: US 12,082,394 B2
(45) Date of Patent: Sep. 3, 2024

(54) METHOD FOR MANUFACTURING MEMORY AND MEMORY

(71) Applicant: CHANGXIN MEMORY TECHNOLOGIES, INC., Hefei (CN)

(72) Inventors: Tao Liu, Hefei (CN); Jun Xia, Hefei (CN); Kangshu Zhan, Hefei (CN); Sen Li, Hefei (CN); Qiang Wan, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/610,433

(22) PCT Filed: Jul. 5, 2021

(86) PCT No.: PCT/CN2021/104576
§ 371 (c)(1),
(2) Date: Nov. 10, 2021

(87) PCT Pub. No.: WO2022/193480
PCT Pub. Date: Sep. 22, 2022

(65) Prior Publication Data
US 2024/0023304 A1    Jan. 18, 2024

(30) Foreign Application Priority Data
Mar. 19, 2021    (CN) .......................... 202110297346.2

(51) Int. Cl.
*H10B 12/00*    (2023.01)
(52) U.S. Cl.
CPC ........... *H10B 12/03* (2023.02); *H10B 12/033* (2023.02)

(58) Field of Classification Search
CPC ......... H01L 28/90; H01L 28/91; H01L 28/92; H10B 12/03; H10B 12/033
See application file for complete search history.

(56) References Cited

U.S. PATENT DOCUMENTS

| 7,494,599 B2 | 2/2009 | Lee et al. |
| 7,951,668 B2 | 5/2011 | Wu et al. |

(Continued)

FOREIGN PATENT DOCUMENTS

| CN | 101052536 A | 10/2007 |
| CN | 101609795 A | 12/2009 |

(Continued)

OTHER PUBLICATIONS

CN107706181A_eng (Year: 2018).*

(Continued)

*Primary Examiner* — Robert G Bachner
*Assistant Examiner* — Molly K Reida
(74) *Attorney, Agent, or Firm* — Syncoda LLC; Feng Ma

(57) ABSTRACT

A method for manufacturing a memory includes: providing a substrate, capacitor contact pads being formed in the substrate; forming a laminated structure on the substrate, the laminated structure including a first laminated structure formed on the substrate and a second laminated structure formed on the first laminated structure; forming first through holes in the second laminated structure; forming a protective layer on side walls of the first through holes, the protective layer in the first through holes enclosing second through holes; and etching the first laminated structure along the second through holes to form third through holes, the third through holes exposing the capacitor contact pads.

18 Claims, 11 Drawing Sheets

(56) References Cited

U.S. PATENT DOCUMENTS

| | | | |
|---|---|---|---|
| 8,557,662 | B2 | 10/2013 | Lee |
| 10,431,458 | B2 | 10/2019 | Hudson et al. |
| 2005/0211668 | A1 | 9/2005 | Pandhumsopom |
| 2007/0049037 | A1 | 3/2007 | Graettinger et al. |
| 2007/0123031 | A1 | 5/2007 | Isogai |
| 2009/0311842 | A1 | 12/2009 | Kuo |
| 2020/0243535 | A1 | 7/2020 | Gambee et al. |
| 2022/0077133 | A1* | 3/2022 | Hsu ............... H10B 12/315 |

FOREIGN PATENT DOCUMENTS

| | | |
|---|---|---|
| CN | 103000584 A | 3/2013 |
| CN | 107706181 A | 2/2018 |
| CN | 108417531 A | 8/2018 |
| CN | 208738232 U | 4/2019 |
| CN | 110061007 A | 7/2019 |
| CN | 110473876 A | 11/2019 |
| CN | 110943163 A | 3/2020 |
| CN | 111710682 A | 9/2020 |
| CN | 112928070 A | 6/2021 |
| JP | H0964020 A | 3/1997 |
| JP | 201250930 A | 12/2012 |
| TW | I225681 B | 12/2004 |

OTHER PUBLICATIONS

International Search Report in Application No. PCT/CN2021/104576, mailed on Dec. 15, 2021.
China first office action in Application No. 202110297346.2, mailed on Jun. 6, 2022.

* cited by examiner

METHOD FOR MANUFACTURING MEMORY AND MEMORY

CROSS-REFERENCE TO RELATED APPLICATIONS

This application is a national stage of International Application No. PCT/CN2021/104576 filed on Jul. 5, 2021, which claims priority to Chinese Patent Application No. 202110297346.2 filed on Mar. 19, 2021. The disclosures of these applications are hereby incorporated by reference in their entirety.

TECHNICAL FIELD

The present application relates to the technical field of storage devices, and in particular, to a method for manufacturing a memory and a memory.

BACKGROUND

Dynamic random access memory (Dram) is a semiconductor memory that writes and reads data rapidly and randomly, and is widely used in data storage devices or apparatuses. The Dram usually includes a laminated structure, capacitor holes are formed in the laminated structure, the capacitor holes are used for forming capacitor structures, and data is read by detecting charges stored in the capacitor structures.

In the related technology, when the memory is manufactured, a mask layer is first formed on the laminated structure, the mask layer has a plurality of etching holes, and the laminated structure is etched along the etching holes to form capacitor holes. When the capacitor holes are formed, the time for etching tops of the capacitor holes is relatively long. The critical dimensions (CD) of the tops of the capacitor holes are usually greater than the critical dimensions of the bottoms of the capacitor holes, and even the bottoms of the capacitor holes are not completely etched, which results in a low yield of the memory. In order to reduce the critical dimension differences between the tops and bottoms of the capacitor holes, the laminated structure is usually over-etched to increase the critical dimensions of the bottoms of the capacitor holes.

However, referring to FIG. 1, during the over-etching of the laminated structure 600, side walls of the capacitor holes 610 are easily bent, and even the capacitor holes 610 are etched through, resulting in short circuits of the capacitor structures and a relatively low yield of the memory.

SUMMARY

In view of the above problems, the present application provides a method for manufacturing a memory and a memory, for improving the yield of the memory.

In order to achieve the above objectives, the present application provides the following technical solutions:

In the first aspect, the present application provides a method for manufacturing a memory, including: providing a substrate, capacitor contact pads being formed in the substrate; forming a laminated structure on the substrate, the laminated structure including a first laminated structure formed on the substrate and a second laminated structure formed on the first laminated structure; forming first through holes in the second laminated structure; forming a protective layer on side walls of the first through holes, the protective layer in the first through holes enclosing second through holes; and etching the first laminated structure along the second through holes to form third through holes, the third through holes exposing the capacitor contact pads.

The method for manufacturing a memory provided by the present application has the following advantages:

In the method for manufacturing a memory provided in the present application, a substrate is first provided, capacitor contact pads being formed in the substrate; a laminated structure is formed on the substrate, the laminated structure including a first laminated structure formed on the substrate and a second laminated structure formed on the first laminated structure; first through holes are formed in the second laminated structure; a protective layer is formed on side walls of the first through holes, the protective layer in the first through holes enclosing second through holes; and the first laminated structure is etched along the second through holes to form third through holes, the third through holes exposing the capacitor contact pads. The side walls of the first through holes are protected by the protective layer, to reduce or avoid damage to the side walls of the first through holes by an etching gas or etching liquid when the third through holes are formed, and to reduce or avoid bending of the side walls of the first through holes and even penetration of the first through holes, thereby improving the yield of the memory. In addition, the first through holes and the third through holes constitute capacitor holes, and the capacitor holes with a high depth-width ratio are etched two times, which reduces the differences in critical dimensions between the tops and bottoms of the capacitor holes, and obtains vertical capacitor holes more easily to further improve the yield of the memory.

In the second aspect, the present application further provides a memory, the memory is provided with capacitor holes, the capacitor holes include first through holes and third through holes communicated with the first through holes, and the first through holes and the third through holes are formed by the above-mentioned method for manufacturing a memory.

The memory provided by the present application is provided with capacitor holes, the capacitor holes include first through holes and third through holes communicated with the first through holes, and the first through holes and the third through holes are formed by the above-mentioned method for manufacturing a memory. Therefore, the memory has the advantages that the first through holes are less bent at the side walls and are unlikely to etch through. Meanwhile, the capacitor holes with a high depth-width ratio are etched two times, which reduces the differences in critical dimensions between the tops and bottoms of the capacitor holes, and obtains vertical capacitor holes more easily to further improve the yield of the memory. The specific effects may refer to the above description, and details are not described herein again.

DETAILED DESCRIPTION

In order to solve the technical problem of relatively low yield of a memory, an embodiment of the present application provides a method for manufacturing a memory. A first laminated structure is first formed on a substrate, and a second laminated structure is formed on the first laminated structure; first through holes are formed in the second laminated structure; a protective layer is formed on side walls of the first through holes, the protective layer in the first through holes enclosing second through holes; and the first laminated structure is etched along the second through holes to form third through holes. The side walls of the first through holes are protected by the protective layer, to reduce or avoid damage to the side walls of the first through holes by an etching gas or etching liquid when the third through holes are formed, and to reduce or avoid bending of the side walls of the first through holes and even penetration of the first through holes, thereby improving the yield of the memory.

To make the above objectives, features, and advantages of the embodiments of the present application more obvious and understandable, the following clearly and completely describes the technical solutions in the embodiments of the present application with reference to the accompanying drawings in the embodiments of the present application. Apparently, the described embodiments are some but not all of the embodiments of the present application. All other embodiments obtained by those of ordinary skill in the art without any creative efforts based on the embodiments of the present application shall fall within the protection scope of the present application.

Figure 1:
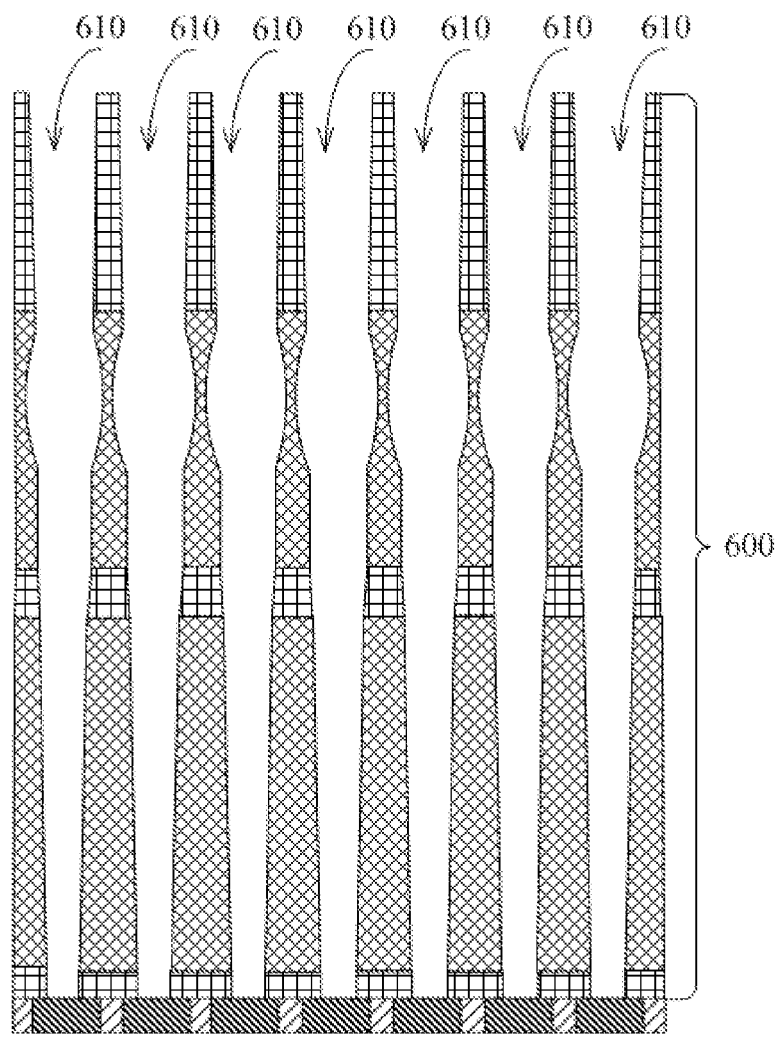
FIG. 1 is a schematic structure diagram of capacitor holes in the related technology.
Figure 2:
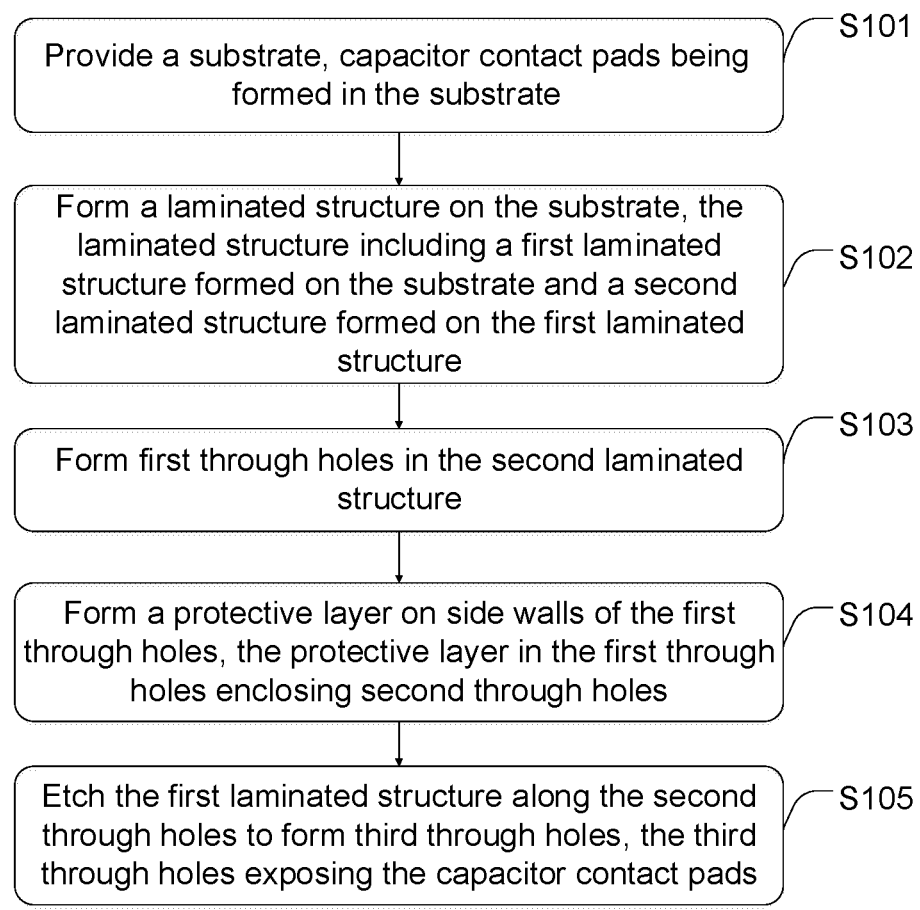
FIG. 2 is a flowchart of a method for manufacturing a memory in an embodiment of the present application.

Referring to FIG. 2, a method for manufacturing a memory in an embodiment of the present application includes the following steps:

Step S101, a substrate is provided, capacitor contact pads being formed in the substrate.

Figure 3:
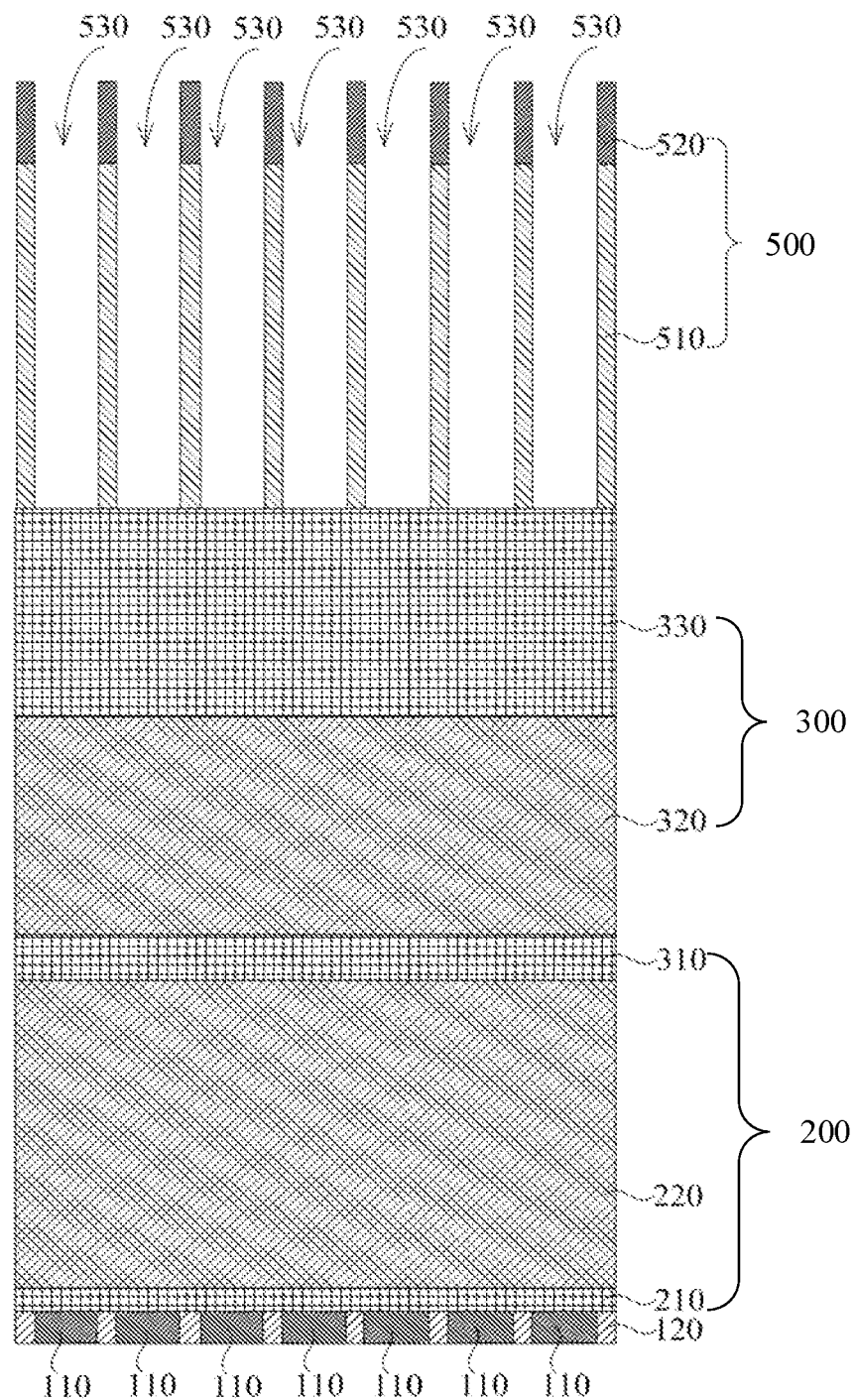
FIG. 3 is a schematic structure diagram after forming etching holes in an embodiment of the present application.

Referring to FIG. 3, capacitor contact pads 110 are disposed in the substrate, and the capacitor contact pads 110 are exposed on the surface of the substrate so as to be exposed in first through holes 340 and third through holes 230 formed later. The number of the capacitor contact pads 110 may be plural, and the plurality of capacitor contact pads 110 are disposed at intervals. As shown in FIG. 3, the capacitor contact pads 110 are separated by barrier layers 120.

The material of the barrier layers 120 may include silicon nitride (SiN), and the material of the capacitor contact pads 110 may include tungsten (W). Of course, the material of the barrier layers 120 and the material of the capacitor contact pads 110 in the embodiment of the present application are not limited. For example, the material of the capacitor contact pads 110 may also include tungsten alloy or other conductive materials.

Step S102, a laminated structure is formed on the substrate, the laminated structure including a first laminated structure formed on the substrate and a second laminated structure formed on the first laminated structure.

In the embodiment of the present application, layers in the laminated structure may be sequentially formed on the substrate by Chemical Vapor Deposition (CVD), Physical Vapor Deposition (PVD) or Atomic Layer Deposition (ALD).

In some possible examples, the laminated structure includes a plurality of sacrificial layers and a plurality of support layers alternately stacked, a number of the plurality of sacrificial layers is n, and a number of the plurality of support layers is n+1, wherein n is a positive integer greater than or equal to 2; the first laminated structure and the second laminated structure each include at least one sacrificial layer. For example, the number of sacrificial layers included in the second laminated structure is i, and the number of sacrificial layers included in the first laminated structure is n−i, wherein i is a positive integer greater than or equal to 1 and less than n.

For example, the laminated structure includes three sacrificial layers and four support layers, the sacrificial layers and the support layers are alternately arranged, and the support layers are located on the outermost sides of the laminated structure, that is, the laminated structure is arranged as support layer-sacrificial layer-support layer-sacrificial layer-support layer-sacrificial layer-support layer. The first laminated structure may include two adjacent sacrificial layers, and the first laminated structure may also include one sacrificial layer. The material of the support layers may include silicon nitride, and the material of the sacrificial layers may include silicon oxide ($SiO_2$).

In the embodiment of the present application, referring to FIG. 3, the laminated structure includes two sacrificial layers and three support layers alternately stacked, the first laminated structure 200 includes one sacrificial layer, and the second laminated structure 300 includes one sacrificial layer. For the convenience of description, as shown in FIG. 3, in a direction away from the substrate, the two sacrificial layers are respectively defined as a first sacrificial layer 220 and a second sacrificial layer 320, the three support layers are respectively defined as a first support layer 210, a second support layer 310 and a third support layer 330, and the first support layer 210 is located on the substrate.

It can be understood that, as shown in FIG. 3, the first support layer 210, the first sacrificial layer 220, the second support layer 310, the second sacrificial layer 320 and the third support layer 330 are sequentially disposed on the substrate. The second laminated structure 300 includes the third support layer 330 and the second sacrificial layer 320, and the first laminated structure 200 includes the second support layer 310, the first sacrificial layer 220 and the first support layer 210.

Step S103, first through holes are formed in the second laminated structure.

Exemplarily, the second laminated structure is etched to form first through holes, the first through holes penetrating the second laminated structure. It can be understood that the first through holes penetrate a plurality of sacrificial layers, a number of the plurality of sacrificial layers is i, wherein i is a positive integer greater than or equal to 1 and less than n.

Figure 4:
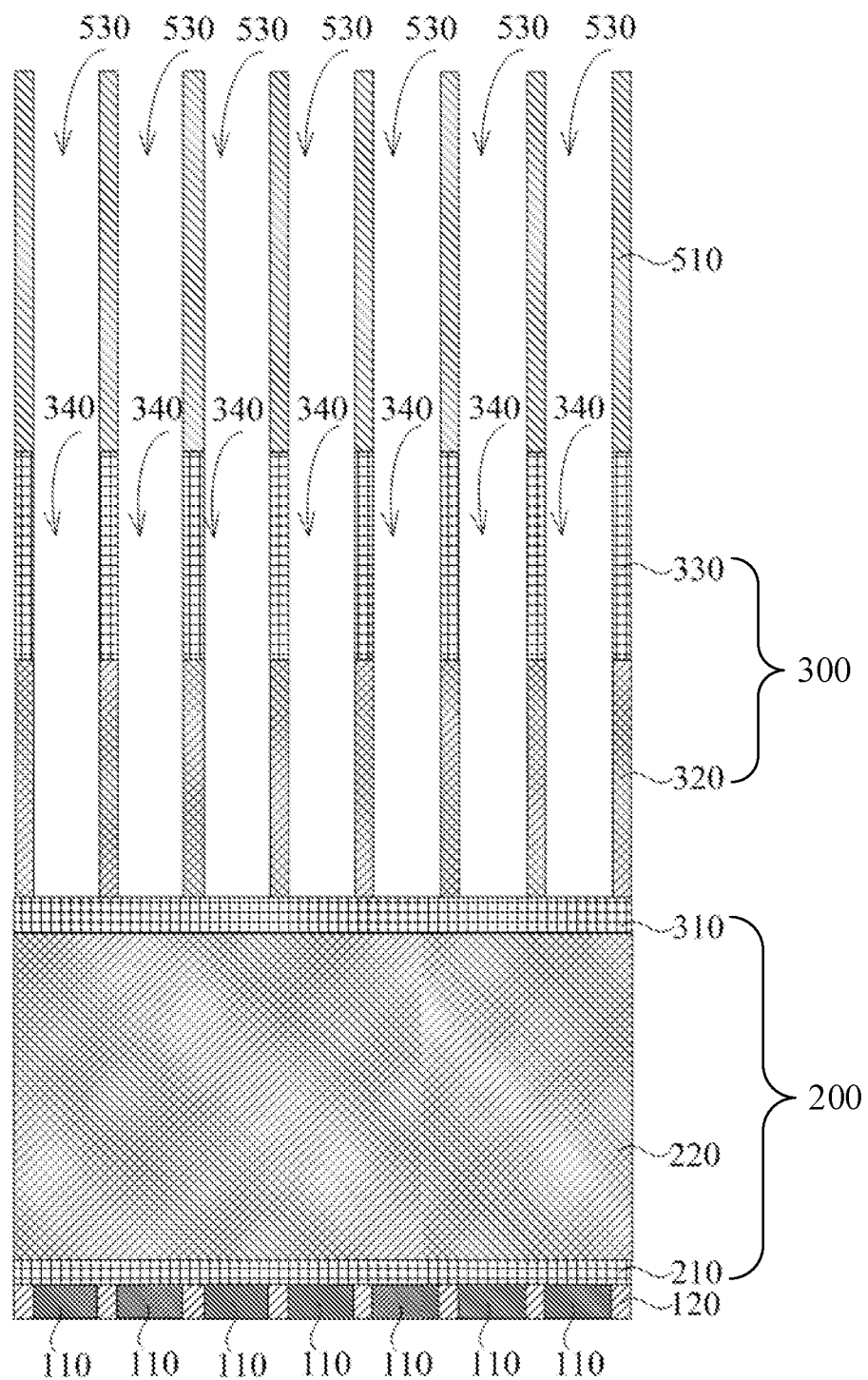
FIG. 4 is a schematic structure diagram after forming first through holes in an embodiment of the present application.

As shown in FIG. 3, the laminated structure includes the first support layer 210, the first sacrificial layer 220, the second support layer 310, the second sacrificial layer 320 and the third support layer 330 sequentially stacked, the second laminated structure 300 includes the third support layer 330 and the second sacrificial layer 320, the first laminated structure 200 includes the second support layer 310, the first sacrificial layer 220 and the first support layer 210, and the first support layer 210 is located on the substrate. Referring to FIG. 4, the forming first through holes 340 in the second laminated structure 300 includes: forming the first through holes 340 in the second laminated structure 300, the first through holes 340 penetrating the third support layer 330 and the second sacrificial layer 320, and the first through holes 340 being opposite to the capacitor contact pads 110.

Referring to FIG. 4, the number of the first through holes 340 may be plural. After a plurality of first through holes 340 are formed in the second laminated structure 300, the plurality of first through holes 340 penetrate the third support layer 330 and the second sacrificial layer 320. The plurality of first through holes 340 are located above the plurality of capacitor contact pads 110, and correspond to the plurality of capacitor contact pads 110 one to one. As shown in FIG. 4, the orthographic projection of each first through hole 340 on the substrate at least partially overlaps with the corresponding capacitor contact pad 110.

Step S104, a protective layer is formed on side walls of the first through holes, the protective layer in the first through holes enclosing second through holes.

Figure 5:
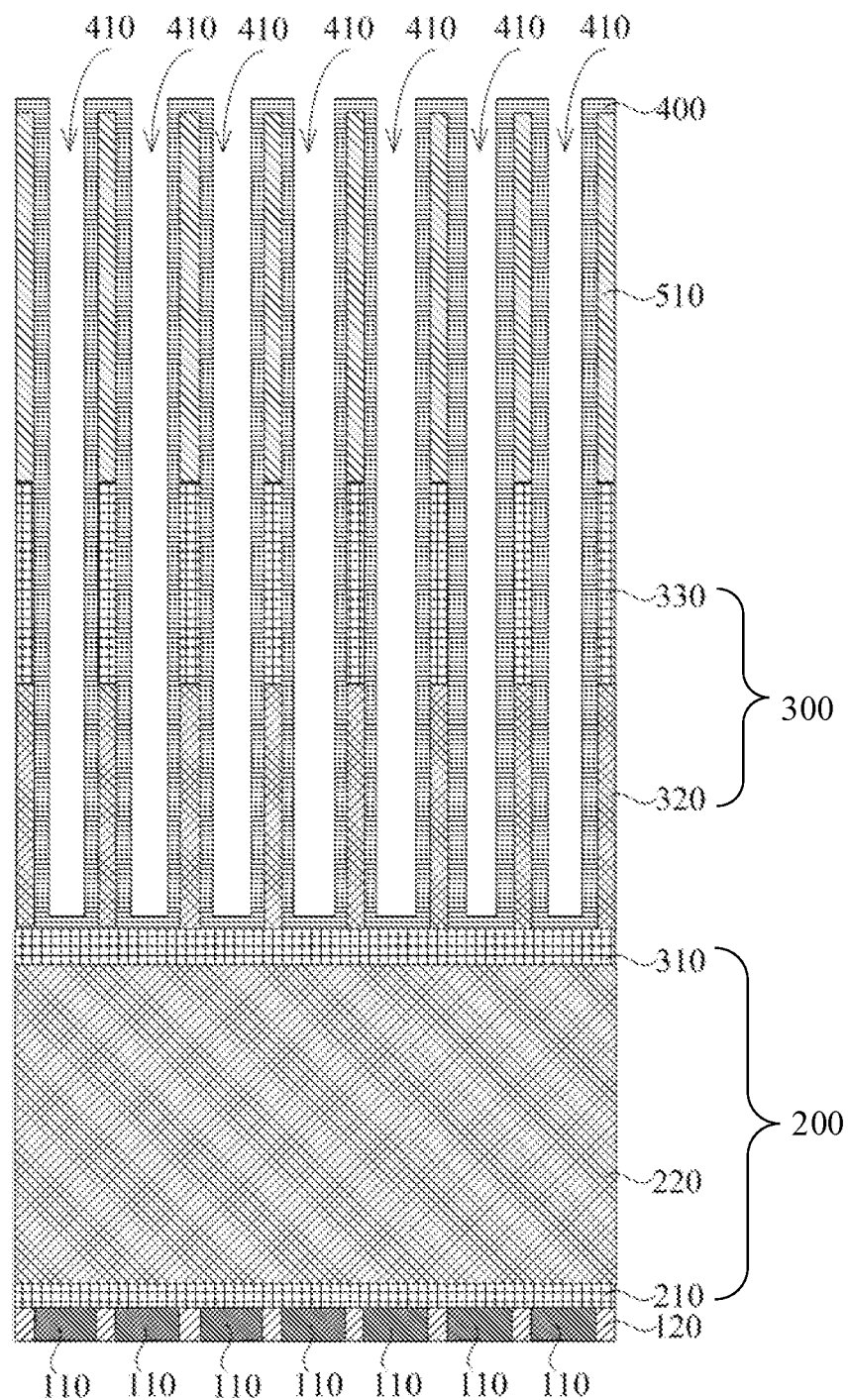
FIG. 5 is a schematic structure diagram after forming a protective layer in an embodiment of the present application.
Figure 6:
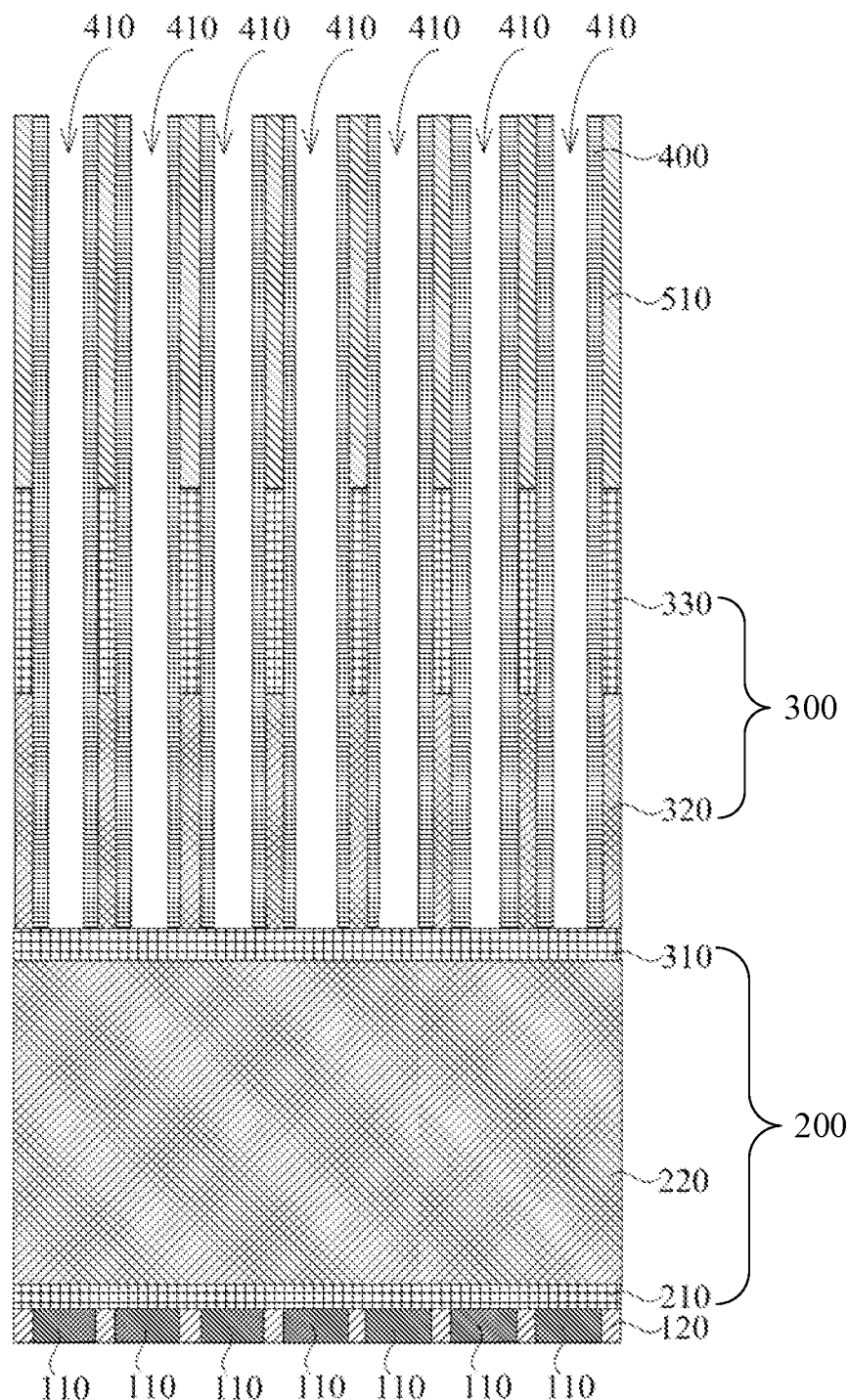
FIG. 6 is a schematic structure diagram after removing the protective layer on the bottoms of the first through holes in an embodiment of the present application.

Referring to FIGS. 5 and 6, the protective layer 400 may be formed by atomic layer deposition, so that the protective layer 400 has good compactness. The material of the protective layer 400 may include polysilicon. The protective layer 400 covers the side walls of the first through holes 340 to form the second through holes 410 to protect the side walls of the first through holes 340, thereby reducing or avoiding damage to the side walls of the first through holes 340 by an etching gas or etching liquid when third through holes 230 are formed later.

Step S105, the first laminated structure is etched along the second through holes to form third through holes, the third through holes exposing the capacitor contact pads.

After the third through holes are formed, the third through holes penetrate the first laminated structure. It can be understood that the third through holes penetrate the remaining plurality of sacrificial layers, a number of the remaining plurality of sacrificial layers is n–i, wherein i is a positive integer greater than or equal to 1 and less than n. The first through holes and the third through holes constitute capacitor holes.

Figure 7:
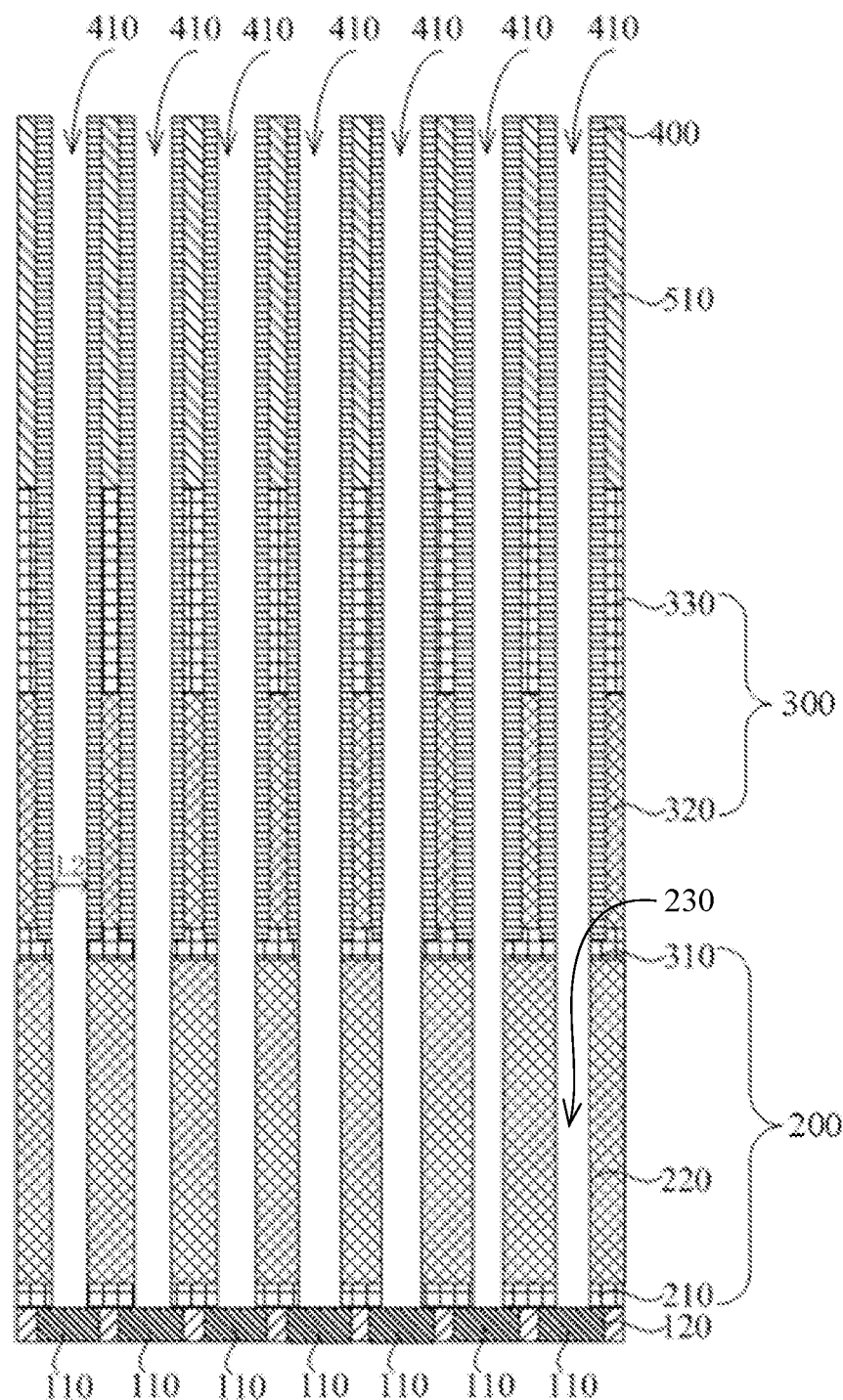
FIG. 7 is a first schematic structure diagram after forming third through holes in an embodiment of the present application.
Figure 8:
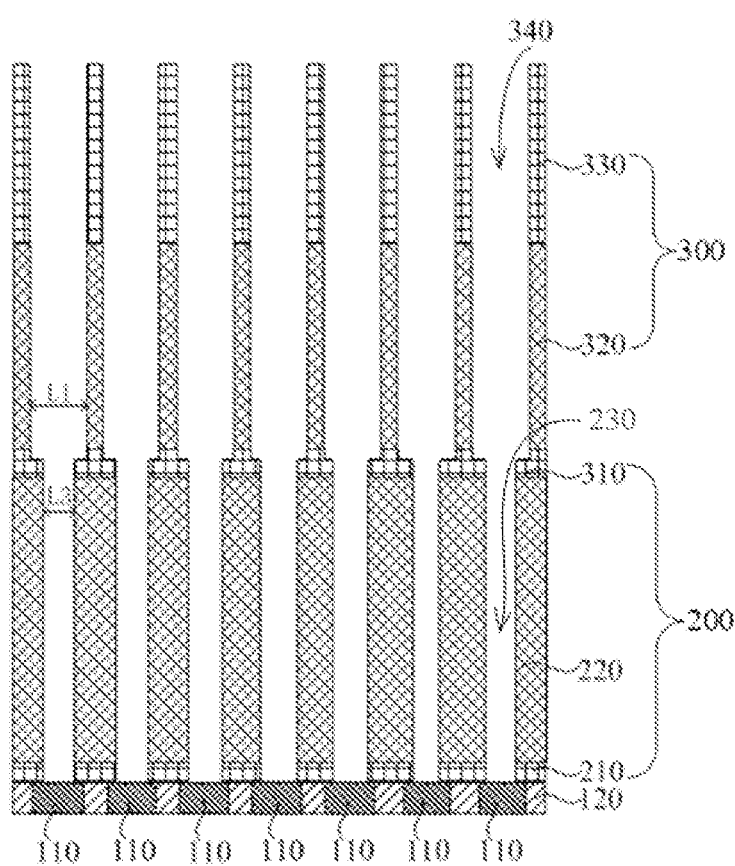
FIG. 8 is a first schematic structure diagram of the first through holes and the third through holes in an embodiment of the present application.

Referring to FIGS. 7 to 11, the laminated structure includes the first support layer 210, the first sacrificial layer 220, the second support layer 310, the second sacrificial layer 320 and the third support layer 330 sequentially stacked, the second laminated structure 300 includes the third support layer 330 and the second sacrificial layer 320, the first laminated structure 200 includes the second support layer 310, the first sacrificial layer 220 and the first support layer 210, and the first support layer 210 is located on the substrate. As shown in FIGS. 7 and 8, the etching the first laminated structure 200 along the second through holes 410 to form third through holes 230 includes: etching the first laminated structure 200 along the second through holes 410 to form the third through holes 230 penetrating the second support layer 310, the first sacrificial layer 220 and the first support layer 210, the third through holes 230 being in contact with the capacitor contact pads 110.

The number of the third through holes 230 may be plural. After a plurality of third through holes 230 are formed in the first laminated structure 200, the plurality of third through holes 230 penetrate the second support layer 310, the first sacrificial layer 220 and the first support layer 210. The plurality of third through holes 230 correspond to the plurality of capacitor contact pads 110 one to one, and the capacitor contact pads 110 are exposed in the corresponding third through holes 230.

In some possible examples, the widths L3 of the third through holes are equal to the widths L2 of the second through holes. For example, the etching gas may include $C_4F_8$, $C_4F_6$ and $O_2$, the etching selection ratio of the protective layer 400 to the sacrificial layers is greater than 100, and the ratio of the longitudinal etching rate of the sacrificial layers to the lateral etching rate of the sacrificial layers is greater than 100. Specifically, the etching selection ratio of the protection layer 400 to the first sacrificial layer 220 is greater than 100, and the ratio of the longitudinal etching rate of the first sacrificial layer 220 to the lateral etching rate of the first sacrificial layer 220 is greater than 100.

Referring to FIGS. 7 and 8, the protective layer 400 is almost not etched, so the second sacrificial layer 320 is not etched. When the first sacrificial layer 220 is etched in the longitudinal direction to form the third through holes 230, it is almost not etched in the lateral direction. The longitudinal direction is the axial direction of the third through holes 230, and the lateral direction is the radial direction of the third through holes 230. It can be understood that the widths L3 of the third through holes 230 are smaller than the widths L1 of the first through holes 340, and the widths may be the diameters of the through holes.

In some other possible examples, the widths L3 of the third through holes are equal to the widths L1 of the first through holes. For example, the etching gas includes $C_4F_8$, $C_4F_6$ and $O_2$, and the ratio of the etching rate of the sacrificial layers to the etching rate of the protective layer 400 is 5 to 20. Specifically, the ratio of the etching rate of the first sacrificial layer 220 to the etching rate of the protective layer 400 is 5 to 20, so that when the first laminated structure 200 is etched to form the third through holes 230, the protective layer 400 is etched, and when the third through holes 230 are formed by etching, all the protective layer 400 is removed by etching.

Figure 9:
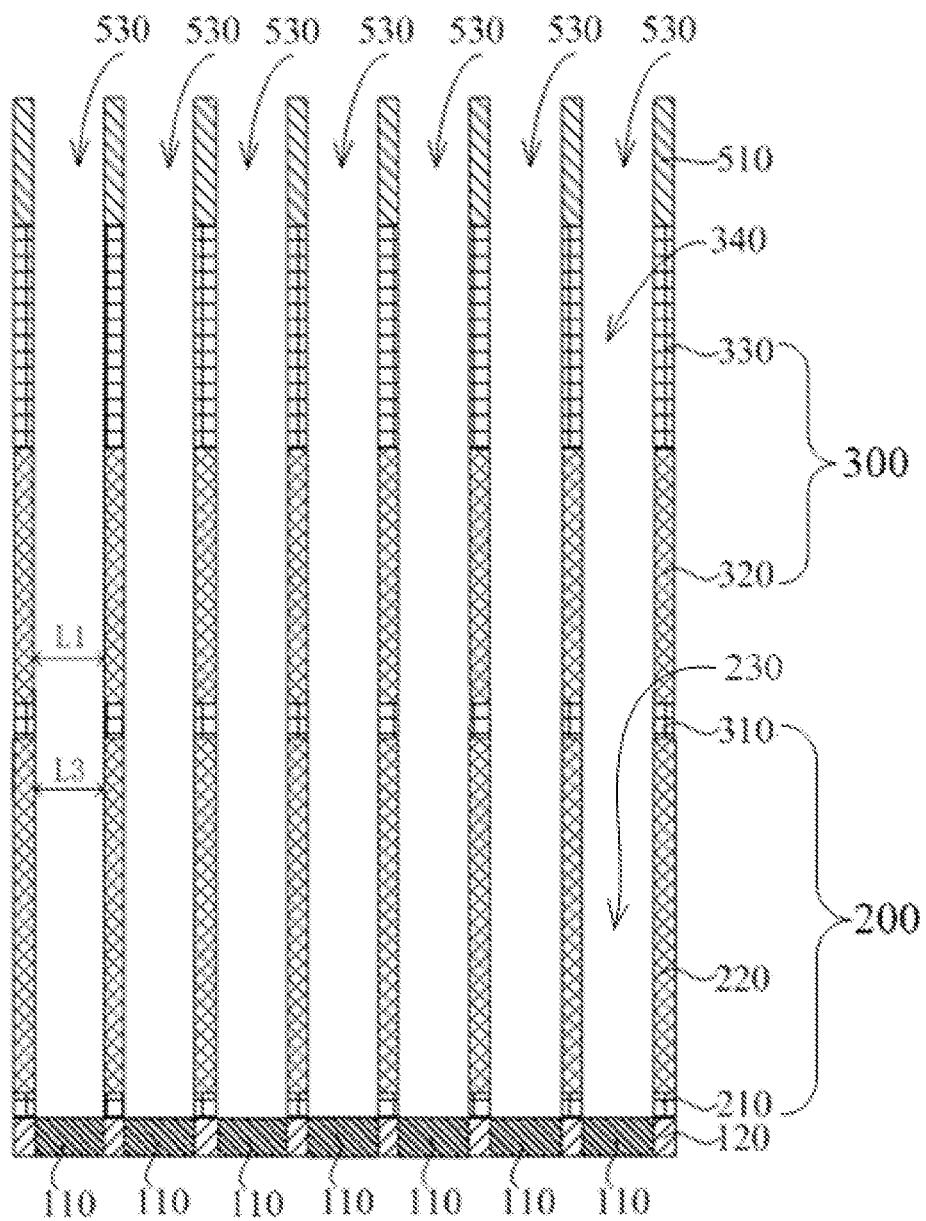
FIG. 9 is a second schematic structure diagram after forming third through holes in an embodiment of the present application.

Referring to FIG. 9, when the third through holes 230 are formed by etching, all the protective layer 400 is removed by etching, and the widths L3 of the third through holes 230 after the etching are equal to the widths L1 of the first through holes 340. For example, the time point when the protective layer 400 is etched is used as an etching stop point. With this configuration, the protective layer 400 in the first through holes 340 does not need to be removed later.

In other possible examples, the etching gas includes $C_4F_8$, $O_2$ and Ar, the etching selection ratio of the protective layer 400 to the sacrificial layers is greater than 100, and the ratio of the longitudinal etching rate of the sacrificial layers to the lateral etching rate of the sacrificial layers is 20 to 50. Specifically, the etching selection ratio of the protective layer 400 to the first sacrificial layer 220 is greater than 100, and the ratio of the longitudinal etching rate of the first sacrificial layer 220 to the lateral etching rate of the first sacrificial layer 220 is 20 to 50.

Figure 10:
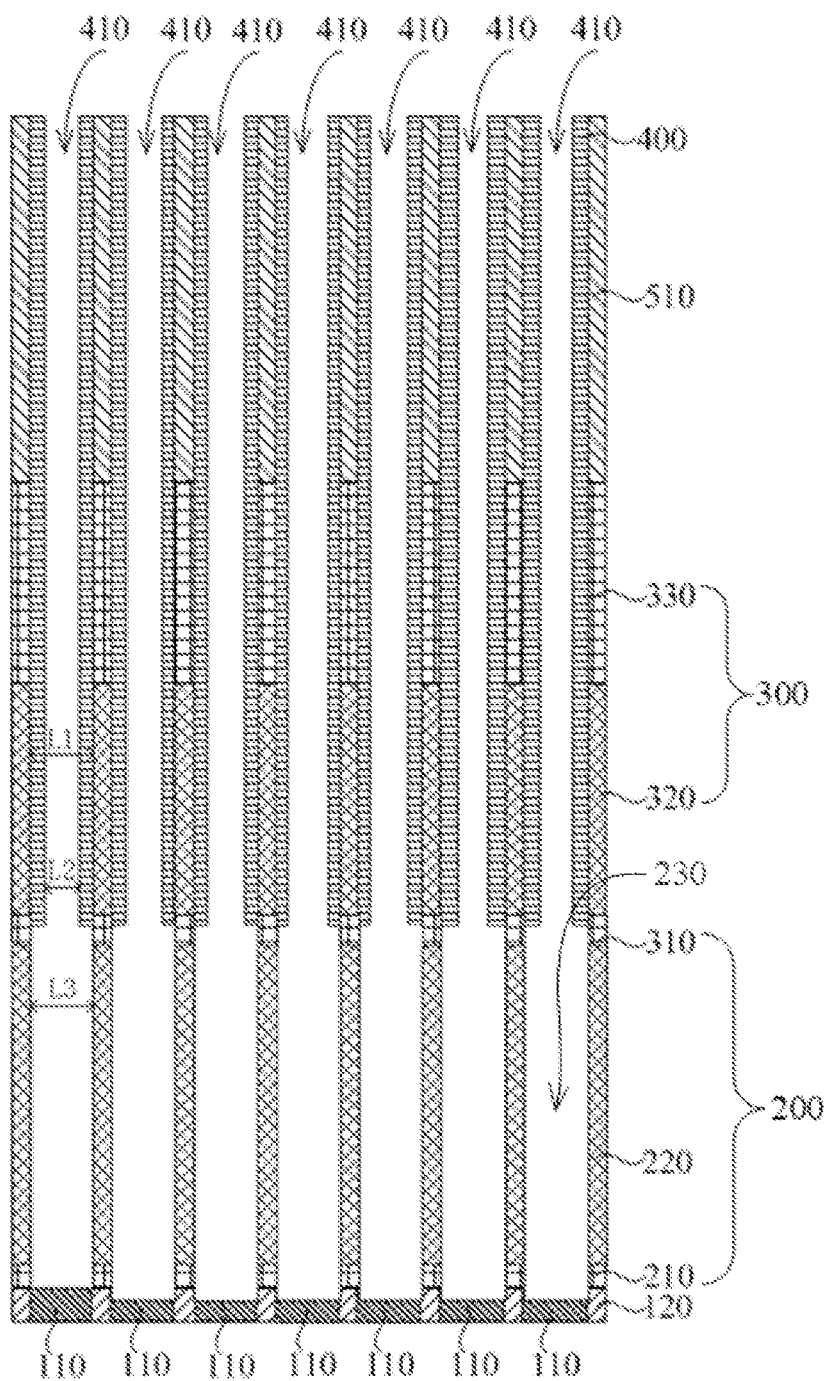
FIG. 10 is a third schematic structure diagram after forming third through holes in an embodiment of the present application.

Referring to FIG. 10, the protective layer 400 is almost not etched, so the second sacrificial layer 320 is not etched. When the first sacrificial layer 220 is etched in the longitudinal direction to form the third through holes 230, part of the first sacrificial layer 220 is etched away in the lateral direction to increase the widths L3 of the third through holes 230, so that the widths L3 of the third through holes 230 after the etching are equal to the widths L1 of the first through holes 340.

Figure 11:
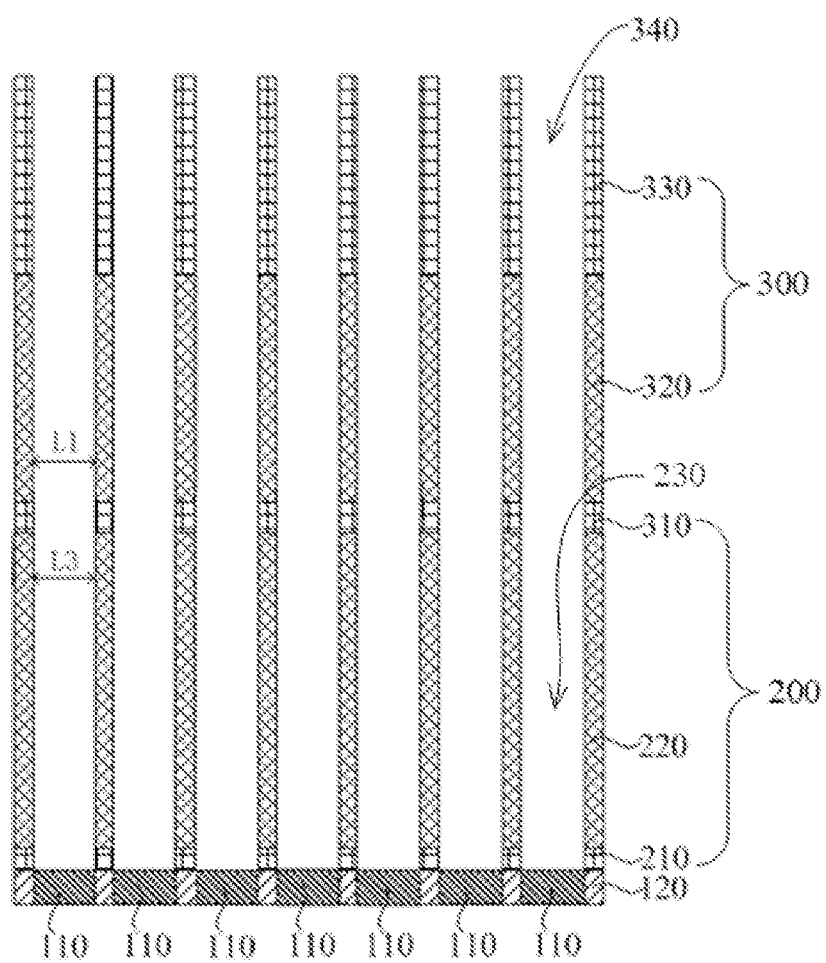
FIG. 11 is a second schematic structure diagram of the first through holes and the third through holes in an embodiment of the present application.

It should be noted that, referring to FIGS. 10 and 11, after the etching the first laminated structure 200 along the second through holes 410 and forming third through holes 230, the method for manufacturing a memory further includes: removing the protective layer 400 on the side walls of the first through holes 340. The protective layer 400 is removed to expose the first through holes 340, and the first through holes 340 and the third through holes 230 constitute capacitor holes.

In the method for manufacturing a memory provided by the embodiment of the present application, a substrate is first provided, capacitor contact pads 110 being formed in the substrate; a laminated structure is formed on the substrate, the laminated structure including a first laminated structure 200 formed on the substrate and a second laminated structure 300 formed on the first laminated structure 200; first through holes 340 are formed in the second laminated structure 300; a protective layer 400 is formed on side walls of the first through holes 340, the protective layer 400 in the first through holes 340 enclosing second through holes 410; and the first laminated structure 200 is etched along the second through holes 410 to form third through holes 230, the capacitor contact pads 110 being exposed in the third through holes 230. The protective layer 400 protects the side walls of the first through holes 340, to reduce or avoid damage to the side walls of the first through holes 340 by an etching gas or etching liquid when the third through holes 230 are formed, and to reduce or avoid bending and even penetration of the side walls of the first through holes 340, thereby improving the yield of the memory. In addition, the first through holes 340 and the third through holes 230 constitute capacitor holes, and the capacitor holes with a high depth-width ratio are etched two times, which reduces the differences in critical dimensions between the tops and bottoms of the capacitor holes, and obtains vertical capacitor holes more easily to further improve the yield of the memory.

It should be noted that, referring to FIGS. 3 to 11, the forming the first through holes in the second laminated structure includes: forming a mask 500 on the second laminated structure 300, etching holes 530 being formed in the mask 500.

In a possible example, the material of the mask 500 may be the same as the material of the protective layer 400. For example, the material of the mask 500 and the material of the protective layer 400 are both polysilicon, so that the mask 500 and the protective layer 400 can be removed at the same time later.

In other possible examples, as shown in FIGS. 3 to 11, the mask 500 may include a polysilicon layer 510 formed on the second laminated structure 300 and an oxide layer 520 formed on the polysilicon layer 510. For example, the oxide layer 520 is a silicon oxide layer, and the etching holes 530 penetrate the polysilicon layer 510 and the oxide layer 520.

After the mask 500 is formed, the third support layer 330 and the second sacrificial layer 320 are etched along the etching holes 530 to form the first through holes 340. As shown in FIGS. 3 and 4, when the mask 500, includes the polysilicon layer 510 and the oxide layer 520, the third support layer 330 and the second sacrificial layer 320 are etched along the etching holes 530, the oxide layer 520 is removed and the polysilicon layer 510 is retained; or, the oxide layer 520 and part of the polysilicon layer 510 are removed. As such, the remaining mask 500 is of a single-layer structure, so that the material of the protective layer 400 is the same as the material of the polysilicon layer 510, and the polysilicon layer 510 and the protective layer 400 can be removed at the same time.

Referring to FIGS. 4 to 11, when the mask 500 is formed on the second laminated structure 300, the forming a protective layer 400 on side walls of the first through holes 340 includes:

The protective layer 400 is deposited on the side walls and bottom walls of the first through holes 340, the side walls of the etching holes 530, and the surface of the mask 500. As shown in FIGS. 4 and 5, the protective layer 400 is formed on the side walls and bottom walls of the first through holes 340, the side walls of the etching holes 530, and the upper surface of the mask 500.

As shown in FIGS. 4 and 5, when the mask 500 includes the polysilicon layer 510 and the oxide layer 520, the second laminated structure 300 is etched along the etching holes 530 to form the first through holes 340, and at the same time the oxide layer 520 of the mask 500 is removed and the polysilicon layer 510 is retained; or, the oxide layer 520 and part of the polysilicon layer 510 are removed and part of the polysilicon layer 510 is retained. That is, at least part of the polysilicon layer 510 is retained. The protective layer 400 is formed on the side walls and bottom walls of the first through holes 340, the side walls of the etching holes 530, and the upper surface of the polysilicon layer 510.

After the protective layer 400 is formed, the protective layer 400 on the bottoms of the first through holes 340 and the mask 500 is removed. As shown in FIG. 6, after part of the protective layer 400 is removed, the bottom walls of the first through holes 340 expose the first laminated structure 200, and the upper surface of the mask 500 and the protective layer 400 are exposed. Exemplarily, as shown in FIG. 6, the upper surface of the polysilicon layer 510 and the protective layer 400 are exposed.

In some possible examples, the protective layer 400 on the bottoms of the first through holes 340 is removed by a plasma etching process, the power of the plasma etching process is greater than 10000 watts, and the frequency is less than or equal to 2 MHz. In the plasma etching process, the plasma bombards the bottom wall of the protective layer 400 more quickly with a larger bias voltage, and the protective layer 400 at the bottoms of the first through holes 340 is removed by anisotropic etching.

Referring to FIGS. 7 and 8, when the mask 500 is formed on the second laminated structure 300, after the etching the third support layer 330 and the second sacrificial layer 320 along the etching holes 530, the mask 500 also needs to be removed. Exemplarily, when the mask 500 includes a polysilicon layer 510 and an oxide layer 520, the oxide layer 520 of the mask 500 is removed through the previous steps, or the oxide layer 520 and part of the polysilicon layer 510 of the mask 500 are removed, to retain at least part of the polysilicon layer 510 of the mask 500. After the etching the third support layer 330 and the second sacrificial layer 320 along the etching holes 530, the method for manufacturing a memory further includes: removing the polysilicon layer 510, or removing the polysilicon layer 510 and the protective layer 400 in the etching holes 530 and the first through holes 340.

The material of the protective layer 400 may be polysilicon, so that the protective layer 400 and the polysilicon layer 510 can be removed at the same time to simplify the manufacturing process. As shown in FIGS. 7, 8, 10 and 11, when the third through holes 230 are formed, the protective layer 400 in the etching holes 530 and the first through holes 340 is almost not etched, and after the third through holes 230 are formed, the polysilicon layer 510 and the protective layer 400 are removed, for example, the polysilicon layer 510 and the protective layer 400 are removed by single etching.

It can be understood that, while the third through holes 230 are formed in the first laminated structure 200, the protective layer 400 is etched to remove at least part of the protective layer 400. When all of the protective layer 400 is removed as shown in FIG. 9, only the polysilicon layer 510 needs to be removed after the third through holes 230 are formed.

An embodiment of the present application further provides a memory. Referring to FIGS. 8 and 11, the memory is provided with capacitor holes, the capacitor holes include first through holes 340 and third through holes 230, the first through holes 340 are communicated with the third through holes 230, and the first through holes 340 and the third through holes 230 are formed by the above-mentioned method for manufacturing a memory. The capacitor holes constituted by the first through holes 340 and the third through holes 230 are less bent at side walls, and are unlikely to etch through, thereby improving the yield of the memory.

The memory provided by the embodiment of the present application is provided with capacitor holes, the capacitor holes include first through holes 340 and third through holes 230 communicated with the first through holes 340, and the first through holes 340 and the third through holes 230 are formed by the above-mentioned method for manufacturing a memory, so that the first through holes 340 are less bent at side walls, and are unlikely to etch through. In addition, the capacitor holes with a high depth-width ratio are etched two times, which reduces the differences in critical dimensions between the tops and bottoms of the capacitor holes, and obtains vertical capacitor holes more easily, so that the capacitor holes are less bent at side walls, and are unlikely to etch through, which improves the yield of the memory.

The embodiments or implementations in this specification are described in a progressive manner, each embodiment focuses on the differences from other embodiments, and the same or similar parts between the various embodiments may be referred to each other.

Those skilled in the art should understand that, in the disclosure of the present application, the orientations or positional relationships indicated by the terms "longitudinal", "lateral", "upper", "lower", "front", "rear", "left", "right", "vertical", "horizontal", "top", "bottom", "inner", "outer", etc. are based on the orientations or positional relationships shown in the accompanying drawings, and are intended to facilitate the description of the present application and simplify the description only, rather than indicating or implying that the system or element referred to must have a particular orientation or be constructed and operated in a particular orientation, and therefore, these terms cannot be interpreted as limiting the present application.

In the description of this specification, the descriptions with reference to the terms"one embodiment", "some embodiments", "exemplary embodiment", "example", "specific example", or "some examples", etc. mean that specific features, structures, materials or characteristics described in conjunction with the embodiments or examples are included in at least one embodiment or example of the present application. In this specification, the schematic descriptions of the above terms do not necessarily refer to the same embodiment or example. Moreover, the described specific features, structures, materials or characteristics may be combined in an appropriate manner in any one or more embodiments or examples.

Finally, it should be noted that the above embodiments are merely intended to describe, but not to limit, the technical solutions of the present application. Although the present application is described in detail with reference to the above embodiments, those of ordinary skill in the art should understand that various modifications may be made to the technical solutions described in the foregoing embodiments or equivalent substitutions may be made to some or all technical features thereof, and these modifications or substitutions do not make the essences of the corresponding technical solutions depart from the scope of the technical solutions of the embodiments of the present application.

What is claimed is:

1. A method for manufacturing a memory, comprising:
providing a substrate, capacitor contact pads being formed in the substrate;
forming a laminated structure on the substrate, the laminated structure comprising a first laminated structure formed on the substrate and a second laminated structure formed on the first laminated structure;
forming first through holes in the second laminated structure;
forming a protective layer on side walls of the first through holes, the protective layer in the first through holes enclosing second through holes; and
etching the first laminated structure along the second through holes to form third through holes, the third through holes exposing the capacitor contact pads;
wherein the laminated structure comprises a plurality of sacrificial layers and a plurality of support layers alternately stacked, a number of the plurality of sacrificial layers is n, and a number of the plurality of support layers is n+1, wherein n is a positive integer greater than or equal to 2;
the first laminated structure and the second laminated structure each comprise at least one sacrificial layer.

2. The method for manufacturing a memory according to claim 1, wherein the first through holes penetrate a plurality of sacrificial layers, a number of the plurality of sacrificial layers is i, and the third through holes penetrate the remaining plurality of sacrificial layers, a number of the remaining plurality of sacrificial layers is n−i, wherein i is a positive integer greater than or equal to 1 and less than n.

3. The method for manufacturing a memory according to claim 1, wherein widths of the third through holes are equal to widths of the second through holes.

4. The method for manufacturing a memory according to claim 3, wherein the etching the first laminated structure along the second through holes to form third through holes:
the etching gas comprises $C_4F_8$, $O_2$ and Ar, the etching selection ratio of the sacrificial layers to the protective layer is greater than 100, and the ratio of the longitudinal etching rate of the sacrificial layers to the lateral etching rate of the sacrificial layers is greater than 100.

5. The method for manufacturing a memory according to claim 1, wherein widths of the third through holes are equal to widths of the first through holes.

6. The method for manufacturing a memory according to claim 5, wherein the etching the first laminated structure along the second through holes to form third through holes:

the etching gas comprises $C_4F_8$, $C_4F_6$ and $O_2$, and the ratio of the etching rate of the sacrificial layers to the etching rate of the protective layer is 5 to 20;

or, the etching gas comprises $C_4F_8$, $O_2$ and Ar, the etching selection ratio of the sacrificial layers to the protective layer is greater than 100, and the ratio of the longitudinal etching rate of the sacrificial layers to the lateral etching rate of the sacrificial layers is 20 to 50.

7. The method for manufacturing a memory according to claim 1, wherein the protective layer is formed by atomic layer deposition.

8. The method for manufacturing a memory according to claim 1, wherein material of the protective layer comprises polysilicon.

9. The method for manufacturing a memory according to claim 1, wherein the laminated structure comprises a first support layer, a first sacrificial layer, a second support layer, a second sacrificial layer and a third support layer sequentially stacked, and the first support layer is located on the substrate.

10. The method for manufacturing a memory according to claim 9, wherein the forming first through holes in the second laminated structure comprises:

forming the first through holes in the second laminated structure, the first through holes penetrating the third support layer and the second sacrificial layer, and the first through holes being opposite to the capacitor contact pads.

11. The method for manufacturing a memory according to claim 10, wherein the etching the first laminated structure along the second through holes to form third through holes comprises:

etching the first laminated structure along the second through holes to form the third through holes penetrating the second support layer, the first sacrificial layer and the first support layer, the third through holes being in contact with the capacitor contact pads.

12. The method for manufacturing a memory according to claim 10, wherein the forming the first through holes in the second laminated structure comprises:

forming a mask on the second laminated structure, etching holes being formed in the mask; and etching the third support layer and the second sacrificial layer along the etching holes to form the first through holes.

13. The method for manufacturing a memory according to claim 12, wherein the forming a protective layer on side walls of the first through holes comprises:

depositing the protective layer on the side walls and bottom walls of the first through holes, side walls of the etching holes, and a surface of the mask; and removing the protective layer on bottoms of the first through holes and the surface of the mask.

14. The method for manufacturing a memory according to claim 13, wherein the protective layer on bottoms of the first through holes is removed by a plasma etching process, the power of the plasma etching process is greater than 10000 watts, and the frequency is less than or equal to 2 MHz.

15. The method for manufacturing a memory according to claim 13, wherein a material of the mask is the same as a material of the protective layer.

16. The method for manufacturing a memory according to claim 12, wherein the mask comprises a polysilicon layer formed on the second laminated structure and an oxide layer formed on the polysilicon layer;

the etching the third support layer and the second sacrificial layer along the etching holes further comprises:
removing the oxide layer and part of the polysilicon layer.

17. The method for manufacturing a memory according to claim 16, wherein after the etching the first laminated structure along the second through holes to form third through holes, the method for manufacturing a memory further comprises:

removing the polysilicon layer;

or, removing the polysilicon layer and the protective layer in the etching holes and the first through holes.

18. A memory, wherein the memory is provided with capacitor holes, the capacitor holes comprise first through holes and third through holes communicated with the first through holes, and the first through holes and the third through holes are formed by the method for manufacturing a memory according to claim 1.

* * * * *